United States Patent
Lin

(12) United States Patent (10) Patent No.: US 6,404,678 B1
(45) Date of Patent: Jun. 11, 2002

(54) SOURCE AND DRAIN SENSING

(75) Inventor: Chin-Hsi Lin, Ching Chao Hu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/840,533

(22) Filed: Apr. 23, 2001

Related U.S. Application Data

(62) Division of application No. 09/475,763, filed on Dec. 30, 1999, now Pat. No. 6,292,395.

(51) Int. Cl.[7] .............................................. G11C 16/06
(52) U.S. Cl. .............................. 365/185.2; 365/185.21; 365/185.18
(58) Field of Search ..................... 365/185.05, 185.16, 365/185.18, 185.2, 185.21, 189.09, 210

(56) References Cited

U.S. PATENT DOCUMENTS

| | | | |
|---|---|---|---|
| 5,283,761 A | 2/1994 | Gillingham | 365/189.07 |
| 5,289,412 A * | 2/1994 | Frary et al. | 365/185.01 |
| 5,463,586 A | 10/1995 | Chao et al. | 365/210 |
| 5,526,313 A | 6/1996 | Etoh et al. | 365/205 |
| 5,612,912 A | 3/1997 | Gillingham | 365/168 |
| 5,621,686 A * | 4/1997 | Alexis | 365/185.21 |
| 5,694,367 A | 12/1997 | Toyoshima et al. | 365/207 |
| 5,717,632 A | 2/1998 | Richart et al. | 365/185.2 |
| 5,886,925 A * | 3/1999 | Campardo et al. | 365/185.21 |

* cited by examiner

*Primary Examiner*—Vu A. Le
(74) *Attorney, Agent, or Firm*—Mark A. Haynes; Haynes Beffel & Wolfeld LLP

(57) ABSTRACT

This invention relates to sensing single and multiple bit non-volatile memories to determine what value is represented, by sensing both the source and drain of the cell being read. Sensing of threshold voltages is employed as an alternative to current sensing. A reference cell or miniarray is used as an input to differential sensing amplifier. The other input sensed is the threshold voltage of the cell being read. By sensing both the source and drain of a selected memory cell, substantial gains in sensing small voltage differentials in memory cells operating at reduced voltages or storing multiple bits of data is achieved.

11 Claims, 9 Drawing Sheets

SOURCE AND DRAIN SENSING

This application is a divisional of U.S. patent application Ser. No. 09/475,763, filed Dec. 30, 1999 U.S. Pat. No. 6,292,395.

BACKGROUND OF THE INVENTION

1. Field of the Invention

This invention relates to sensing single and multiple bit non-volatile memories to determine what value is represented. In particular, it relates to a device and method for sensing the source and drain of the cell being read.

2. Description of the Related Art

Sense amplifiers are used to determine the data value or values stored in a non-volatile memory. In a conventional sensing scheme, a current through the memory cell being sensed is compared to a reference current by a current-sensing sense amplifier. The ratio of the desired cell current to the reference current is referred to as the sensing ratio SR. A conventionally preferred sensing ratio is 2:1. When the current through the selected cell is more than twice the reference current (Ir), a value of "1" is sensed. When the current is significantly less than twice the reference current, a value of "0" is sensed. A current close to the sensing ratio may take longer to sense or may produce an indeterminate result. Manufacturing and operating variations limit the effectiveness of current sensing.

Newer, low voltage memory cells and multi-bit memory cells are difficult to sense using the conventional current sensing scheme described above. Low voltage memory cells are designed to minimize current flow. Multi-bit memory cells have less read margin, due to the multiple threshold voltages that define the multiple bit values of a cell. Accordingly, a novel approach that relies on sensing both the source and drain of a selected cell, as an alternative to sensing only the drain, is described below.

SUMMARY OF THE INVENTION

In one embodiment, the present invention provides a device for sensing the threshold voltage of at least one non-volatile memory cell, selectable from an array of memory cells, comprising: at least one non-volatile memory cell; a first voltage generator, coupled to the drain of the memory cell; at least one reference cell, coupled to the source of the memory cell; a second voltage generator, coupled to the reference memory cell; and a differential amplifier coupled to the first and second voltage generators. This embodiment may additionally include a current source having an input stimulus; a current mirror coupled to the current source; a voltage biasing circuit coupled to the current mirror; a virtual ground; and a current limiter coupled between the source of the memory cell and the virual ground, further coupled and responsive to the voltage biasing circuit. One aspect of this embodiment may be that the gate of the reference cell is coupled and responsive to the first voltage generator. Other aspects may be that the current source is comprised of a miniarray having drain, source and gate nodes, and a particular voltage is applied to the miniarray gate node as the input stimulus, and the miniarray is formed during the same process as the non-volatile memory cell.

Another embodiment provides a device for sensing the threshold voltage of at least one non-volatile memory cell which is selectable from an arranged collection of memory cells and has a drain and source, comprising: a conductor; at least one non-volatile memory cell, coupled to the conductor; a first voltage generator, coupled to the non-volatile memory cell; at least one reference memory cell, coupled to the conductor; a second voltage generator, coupled to the reference memory cell; and a differential amplifier coupled to the first and second voltage generators. As above, this embodiment may additionally include a current source having an input stimulus; a current mirror coupled to the current source; a voltage biasing circuit coupled to the current mirror; a virtual ground; and a current limiter coupled between the source of the memory cell and the virtual ground, further coupled and responsive to the voltage biasing circuit. The aspects of gate coupling, miniarray current source and miniarray formation described above may also be part of this embodiment.

An alternative embodiment of the present invention provides a method of sensing a non-volatile memory cell which is selectable from an arranged collection of memory cells and has a drain and source, comprising the steps of: coupling the non-volatile memory cell to a conductor; coupling a reference memory cell to the conductor; coupling the non-volatile memory cell to a first voltage generator; coupling the reference memory cell to a second voltage generator; and sensing with a differential amplifier the voltages of the first and second voltage generators. This embodiment may further include the step of driving the gate of the reference memory cell from the first cell level voltage generator. An aspect of this embodiment may be that the non-volatile memory cell and the reference memory cell are coupled to the conductor through a current limiter, and the method further includes the step of driving the current limiter device responsive a current source including a miniarray which was formed during the same process as the non-volatile memory cell.

In a further embodiment, the present invention provides a device for sensing multiple threshold voltages of at least one multi-level non-volatile memory cell, which is selectable from an arranged collection of memory cells and has a drain and source, comprising: at least one memory cell, having a source and drain; a first voltage generator, coupled to the drain of the memory cell; at least three reference cells having threshold voltages corresponding to threshold voltages for data values stored in the memory cell, coupled to the source of the memory cell; a second voltage generator, coupled to the drain of reference memory cell; and a differential amplifier coupled to the first and second voltage generators. This embodiment may also include the current source, current mirror, voltage biasing circuit, virtual ground and current limiter summarized above. The aspects of gate coupling, miniarray current source and miniarray formation described above may also be part of this embodiment.

Alternatively, the present invention may be embodied in a device for sensing multiple threshold voltages of at least one multi-level non-volatile memory cell which is selectable from an arranged collection of memory cells and has a drain and source, comprising: a conductor; at least one multi-level non-volatile memory cell, coupled to the conductor; a first voltage generator, coupled to the multi-level non-volatile memory cell; a plurality of reference memory cells, coupled to the conductor; a second voltage generator, coupled to the multi-level non-volatile memory cell; logic for selecting among reference memory cells to be compared to the multi-level non-volatile memory cell; and a differential amplifier coupled to the reference cells and the non-volatile memory cell. It may also include a current source having an input stimulus; a current mirror coupled to the current source; a voltage biasing circuit coupled to the current mirror; and a current limiter coupled between the conductor and both the reference memory cell and the non-volatile memory cell, farther coupled and responsive to the voltage biasing circuit. The aspects of miniarray current source and miniarray formation summarized above may also be part of this embodiment.

A multi-level memory cell embodiment employing the concepts of the present invention may provide a method of sensing for a multi-level non-volatile memory, the memory cell having a source and drain and being selectable from an arranged collection of memory cells, by comparing it to first, second and third reference cells having sources and drains, comprising: coupling the drain of the memory cell to a first voltage generator; coupling the drain of the first reference cell having a threshold voltage Vt1 to a second voltage generator; comparing the voltages of the first and second voltage generators using a differential amplifier to produce a first bit value; coupling alternatively the drain of the second reference cell having a threshold voltage Vt0 or the drain of the third reference cell having a threshold voltage Vt2 to the second voltage generator, in response to the first bit value; and comparing the voltages of the first and second voltage generators using the voltage-sensing differential amplifier to produce a second bit value. This embodiment also may include the step of coupling the source of the memory cell to the source of which ever of the first, second and third reference cells are coupled to the second voltage generator.

The present invention, as summarized above draws less current through a selected memory cell than conventional current sensing amplifiers. Use of a voltage generator reduces the current draw.

By sensing both the source and drain of a selected memory cell, some embodiments of the present invention produce substantial gains in sensing small voltage differentials in memory cells operating at reduced voltages or storing multiple bits of data. In other embodiments, the present invention accounts for variations in manufacturing processes and fluctuations in operating conditions through use of a current limiting device controlled by a current source through a current mirror and biasing device.

Sensing both the source and drain of a selected memory cell permits sensing of multiple bits stored in the same memory cell at distinct thresholds, thereby increasing the amount of data that can be stored in the same area on a memory device.

DETAILED DESCRIPTION

Voltage Sensing

Figure 1:
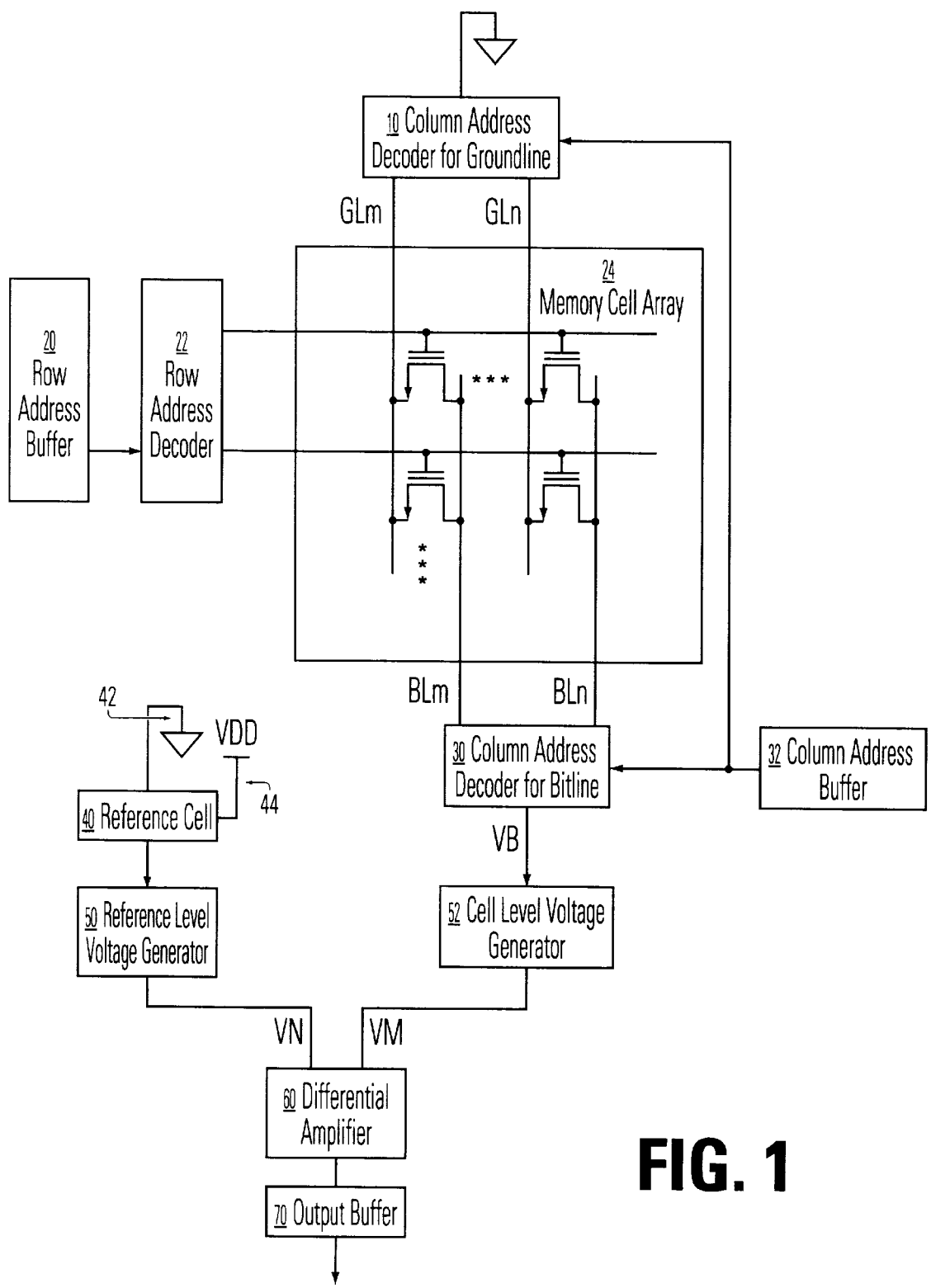
FIG. 1 is a block diagram of a voltage sensing approach in which the reference cell is grounded, without sensing the same ground as the selected memory cell.
Figure 2:
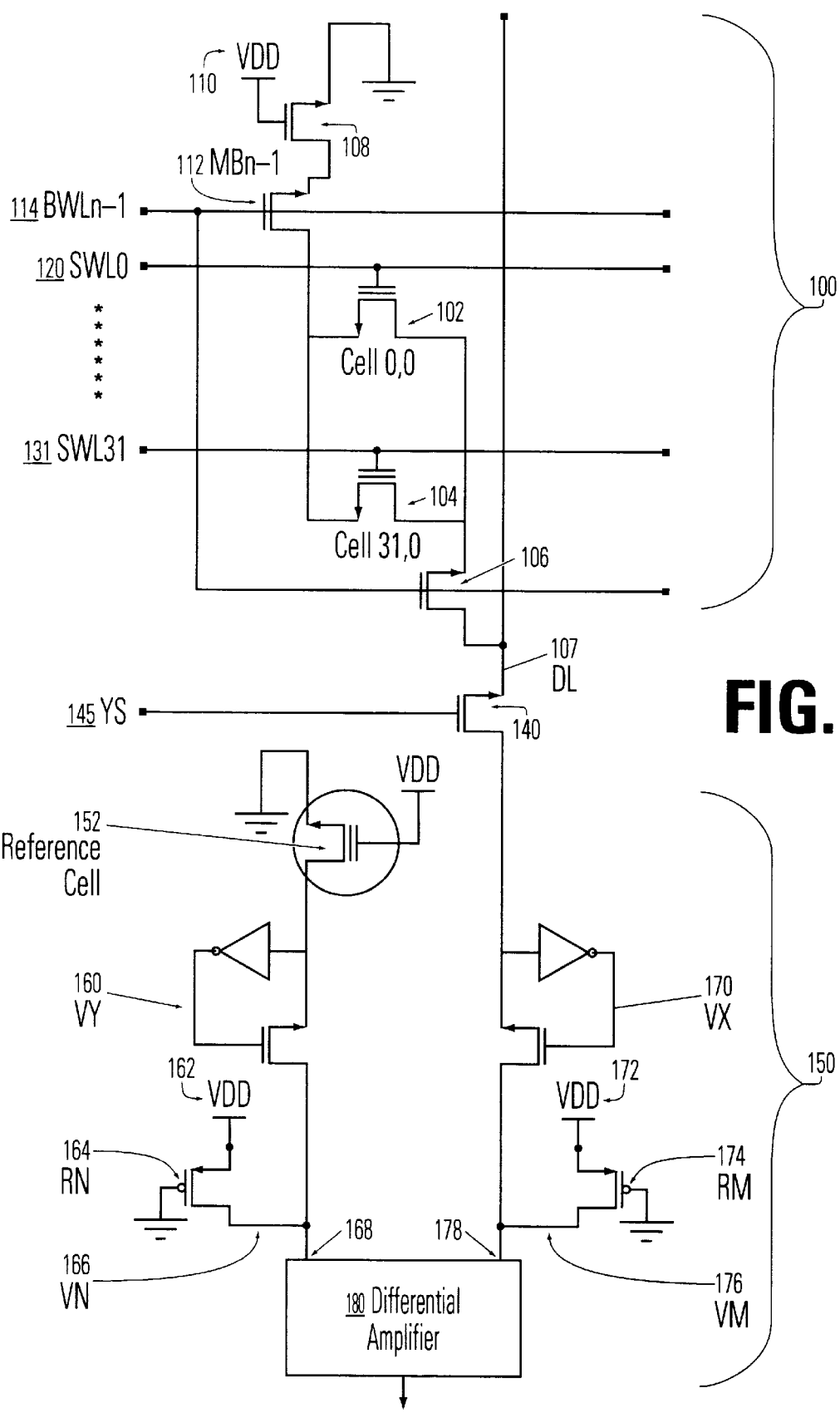
FIG. 2 is a circuit diagram corresponding to FIG. 1.

FIGS. 1 and 2 illustrate voltage sensing as an alternative to current sensing for reading a selected non-volatile memory cell. FIG. 1 is a block diagram and FIG. 2 a corresponding circuit diagram. FIG. 1 depicts a column address decoder 10 for a conductor or groundline, which is coupled to a ground or virtual ground and selectably coupled to a memory cell array 24. The column address decoder for groundline is coupled and responsive to the column address buffer 32. The memory cell array 24 comprises a collection of memory cells arranged in rows and colunms, each memory cell having a drain and a source. The memory cell array may comprise read-only memory (ROM), or devices such as CMOS, NMOS or bipolar transistors which are configured to perform as EPROMs (Electrically Programmable Rad Only Memories), IEEPROMs (Electrially Erassable Programmable Read Only Memories), or any other form of non-volatile memory. Individual conductors or groundlines along columns are identified as GLm through GLn. Coupled to the memory cell array along the rows is a row address buffer 20 coupled to a row address decoder 22 which, in turn, is coupled to rows of cells in the memory cell array. A column address decoder 30 for bitlines is coupled to the memory cell array 24 and coupled and responsive to the column address buffer 32. A voltage generator 52 is coupled to the column address decoder 30, receiving a voltage signal of VB and generating a voltage signal of VM. This voltage generator is responsive to the current through the selected memory cell.

FIG. 1 further shows a reference cell and comparing the threshold voltage of the reference cell to the threshold voltage of the selected cell in the memory array. Reference cell 40 is coupled to ground 42 and to a source voltage VDD 44. A reference level voltage generator 50 is coupled to the reference cell and generates a voltage VN which reflects the current through the reference cell and, thus, the threshold voltage of the reference cell. A voltage sensing differential amplifier 60 compares the voltage signals VN and VM and produces a signal which is stored in output buffer 70.

FIG. 2 is a circuit diagram corresponding to block diagram FIG. 1. Section 100 of FIG. 2 is the memory cell array and the corresponding address buffers and decoders. Memory cells 102 and 104 are arranged in blocks and selected for individual sensing via block, row, and column selection lines. Two memory cells are shown, also labeled as Cell 0,0 and Cell 31,0, which are representative of cells being arranged in groups of 32. The switching wordlines labelled SWL0 120 and SWL31 131 are coupled to the gates of individual selected memory cells. The switching line BWLn−1 114 controls the gates of transistor devices Mbn−1 112 and 106, for selecting a memory cell block Transistor 112 is coupled to a load 108 having its gate tied to a voltage driver VDD 110 which, in turn, is coupled to a ground or virtual ground Through the load and pass devices 108 and 112, this ground is coupled to Cell 0,0 102 and Cell 31,0 104. Signal YS 145 is a decoding signal to pass gate 140, which enables coupling between the memory array and the sensing circuitry 150.

Section 150 of FIG. 2 is voltage sensing circuitry, including a differential amplifier and a reference cell. In one embodiment, the source of reference cell 152 is connected to a ground or virtual ground and its gate is tied to a voltage driver VDD. Biasing device 160 comprises an invertor and a transistor. The source of the transistor is connected to the invertor which is connected back to the gate of the transistor. The source of the transistor also is connected to the drain of the reference cell 152. The drain of the transistor is connected to the voltage source VN 166. The biasing device settles to voltage VY, responsive the voltage from the reference cell 152 and to the voltage VN 166 from P-type transistor 164 which has its drain coupled to voltage driver 162 and its gate tied to ground. The biasing device 160 and the voltage source 162, 164 and 166 together serve as a voltage generator. On the memory array side of section 150, the memory cell array is coupled to a similar voltage generator. Biasing device 170 comprises an invertor and a transistor in the same configuration as biasing device 160, settling to voltage VX, responsive the voltage from the memory array through gate 140 and the voltage VM 176 from transistor 174 which has its drain coupled to voltage driver 172 and its gate tied to ground. The voltages VN and VM reflect of the threshold voltages of the reference cell 152 and the selected memory cell (e.g., 102). Differential amplifier 180 evaluates voltages VN and VM through connections 168 and 178. The differential amplifier outputs a result which passes to an output buffer which is depicted in FIG. 1 but not in FIG. 2.

This embodiment of voltage sensing is an alternative to using a current sensing differential amplifier, but another embodiment produces yet more gain for reading at low read margins or small sensing ratios. In this embodiment, a data "1" is results from a low VM and a high VN, whereas a data "0" results form a high VM and a low VN. Another embodiment of voltage sensing is illustrated in FIGS. 3–4.

Source and Drain Sensing

Figure 3:
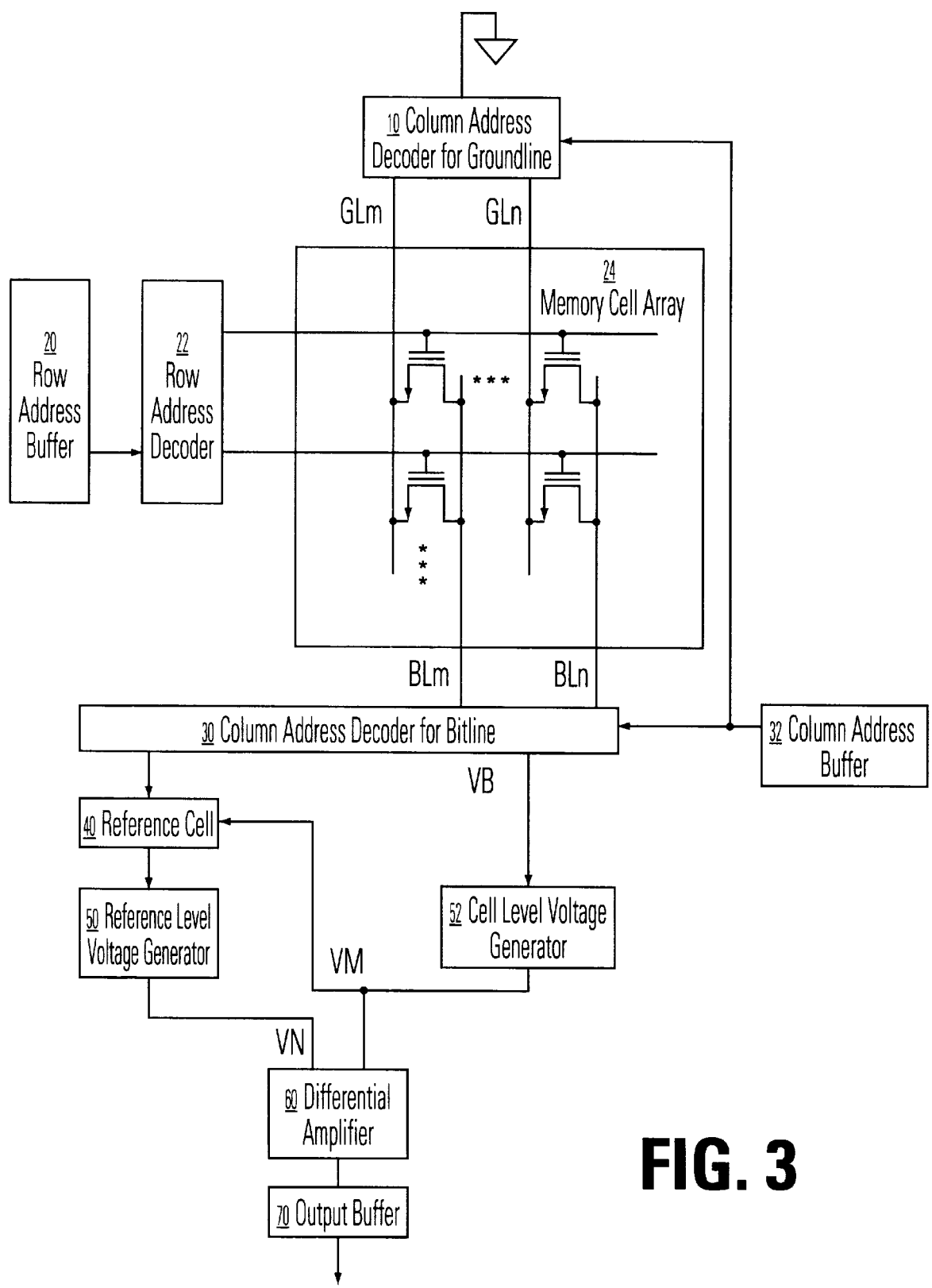
FIG. 3 is a block diagram of a voltage sensing approach in which the reference cell is connected to the same ground as the selected memory cell.
Figure 4:
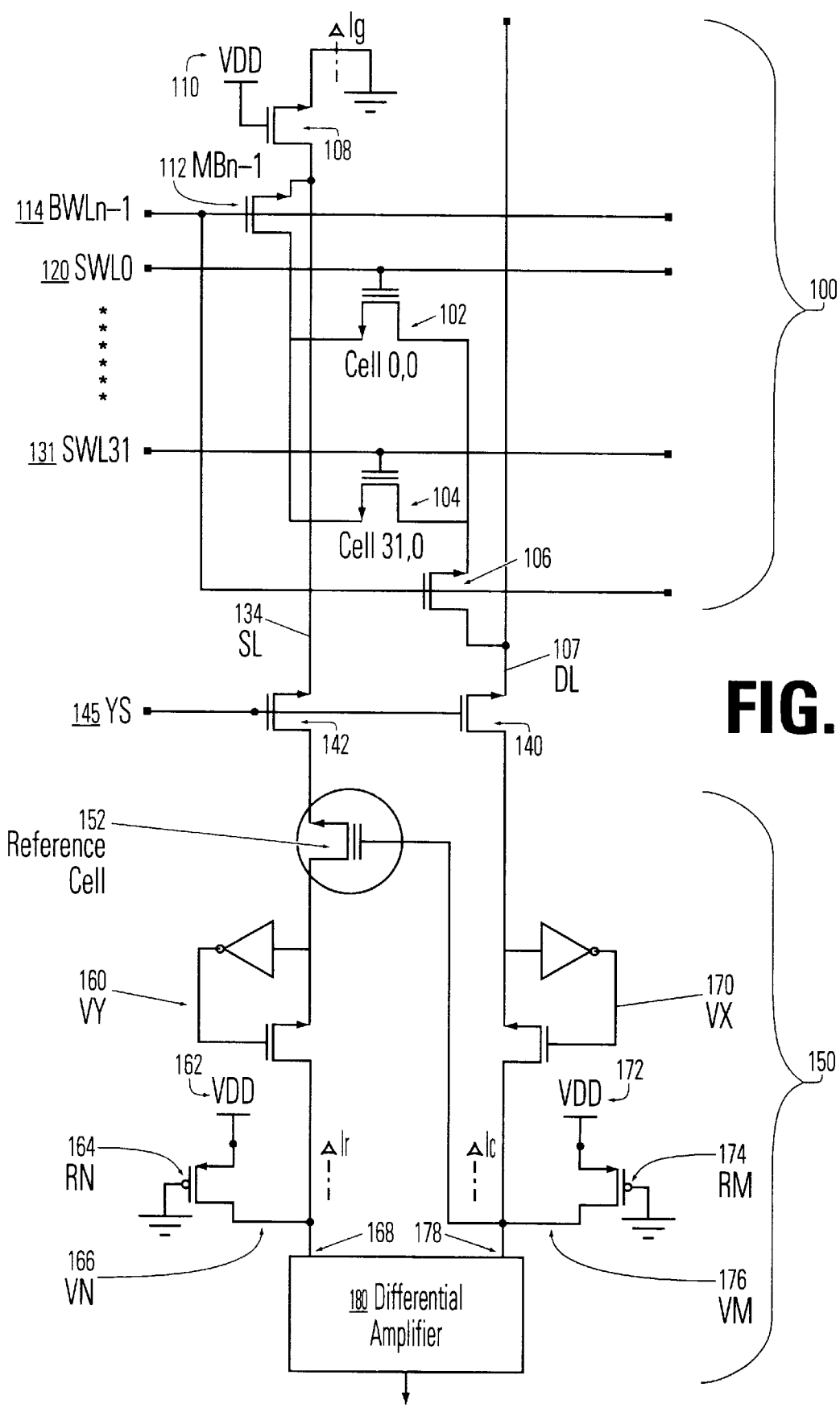
FIG. 4 is a circuit diagram corresponding to FIG. 3.

FIGS. 3 and 4 show source and drain sensing, as an enhancement of the device in FIGS. 1 and 2. First, the reference cell 152 is selectably coupled through a pass gate 142 which is controlled by signal YS 145 to the source of the selected memory cell and, thus, to the same ground (108–112) as the memory cell being sensed (e.g., 102 or 104). Second, the gate of the reference cell 152 is connected to VM 176 instead of a voltage driver.

Coupling reference cell 152 to the source of the selected memory cell and, thus, to the same ground as the memory cell being sensed reduces the effect of manufacturing and operating variations. Conventionally, only the drain of the selected memory cell would be sensed. The conventional approach cannot take into account the actual voltage at the source of the selected memory cell, because the source is not sensed. By sensing the source of the selected memory cell, the embodiment illustrated in FIGS. 3 and 4 accounts for variations in manufacturing and fluctuations in operation conditions that otherwise would be noise in the circuit.

Coupling the gate of reference cell 152 to VM 176 instead of a voltage driver further improves the operation of the circuit. In operation, when the selected memory cell has a "1" value, the current Ic through the selected cell is equal to the current Ig through the ground and the current Ir through the reference cell is minimal. At the voltage sensing differential amplifier, when the selected memory cell has a "1" value, the voltage VN 166 on the reference cell side 168 is nearly equal to the voltage driver VDD. The voltage VM will be low. When the selected memory cell has a "0" value, the current Ic through the selected cell is minimal and the current Ir through the reference cell is equal to the current Ig through the ground. At the voltage sensing differential amplifier, when the selected memory cell has a "0" value, the voltage VM 176 on the selected cell side 178 is nearly equal to the voltage driver VDD and the voltage VN will be low.

Source and Drain Sensing with Controlled Current

Figure 5:
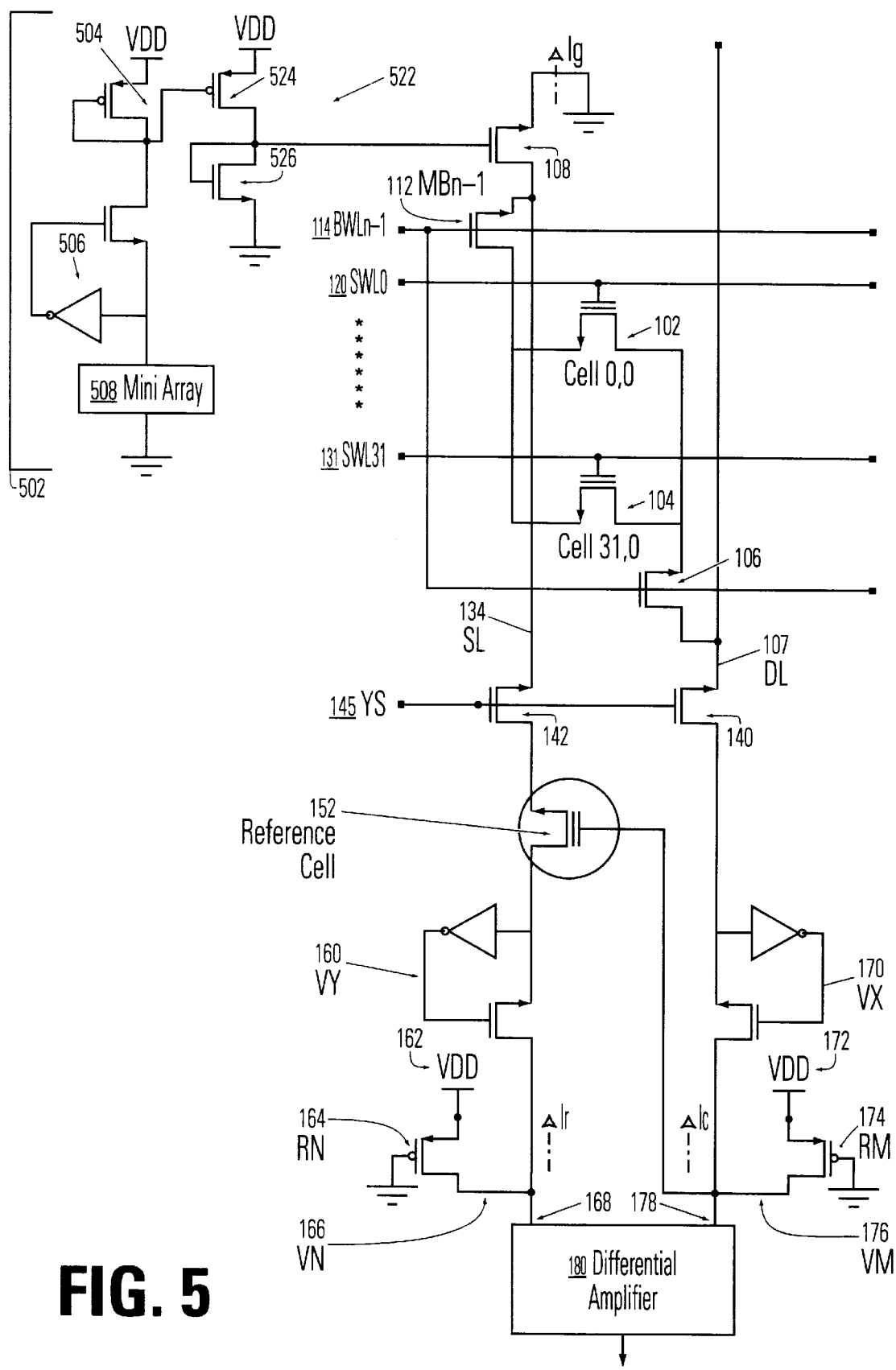
FIG. 5 is an improvement on the voltage sensing of FIGS. 3–4, in which the ground for the reference cell and the selected memory cell is controlled by a current limiting device.

A controlled current ground has proven usefull in the programming of certain types of non-volatile memory. FIG. 5 illustrates source and drain sensing combined with a current controlled ground. The circuitry of sections 502 and 522 in FIG. 5 controls the ground through transistor 108. The controlled current circuitry delivers a constant, predefined current which takes into account process variation and thereby reduces noise. The current mirror 502 is coupled to a biasing circuit 522. Circuit 502 is comprised of a P-type transistor 504 having its drain tied to a voltage driver VDD and its source coupled to the drain of an N-type transistor. The N-type transistor and an invertor 506 are arranged so that the source of the transistor is connected to the inverter which is connected back to the gate of the transistor. The source of the transistor is also coupled to the drain of the miniarray 508. The miniarray 508 serves as a current source and includes a source node connected to ground and a gate node which is supplied with an input stimulus or gate voltage (not shown) which defines the level current that flows through the current mirror 502. The miniarray is formed during the same process as the non-volatile memory cell that is being sensed. Thus, the miniarray will tend to be influenced by the same variations in manufacturing and fluctuations in operating conditions that influence the selected memory cell. The gate of P-type transistor 504 is connected its source and to the gate of P-type transistor 524, which is part of biasing circuit 522. Transistor 524 has its drain tied to a voltage driver VDD and its source connected both to the drain and gate of transistor 526 and to the gate of transistor 108, which serves as a current limiting device. Overall, circuit 522 serves to provide a biasing voltage proportional to the current from the current mirror. This biasing voltage is applied the gate of a current limiter transistor device 108, which is coupled with the memory cells via the network of switching lines described above. In operation, the current through the current limiter 108 will be a constant function of the current through the mirror device 502 (e.g., a constant m times the current). The biasing circuit 522 comprises a P-type transistor coupled at its source to a voltage driver, coupled at its gate with another P-type transistor and coupled at its drain with a biasing circuit.

Simulation Data

Figure 6:
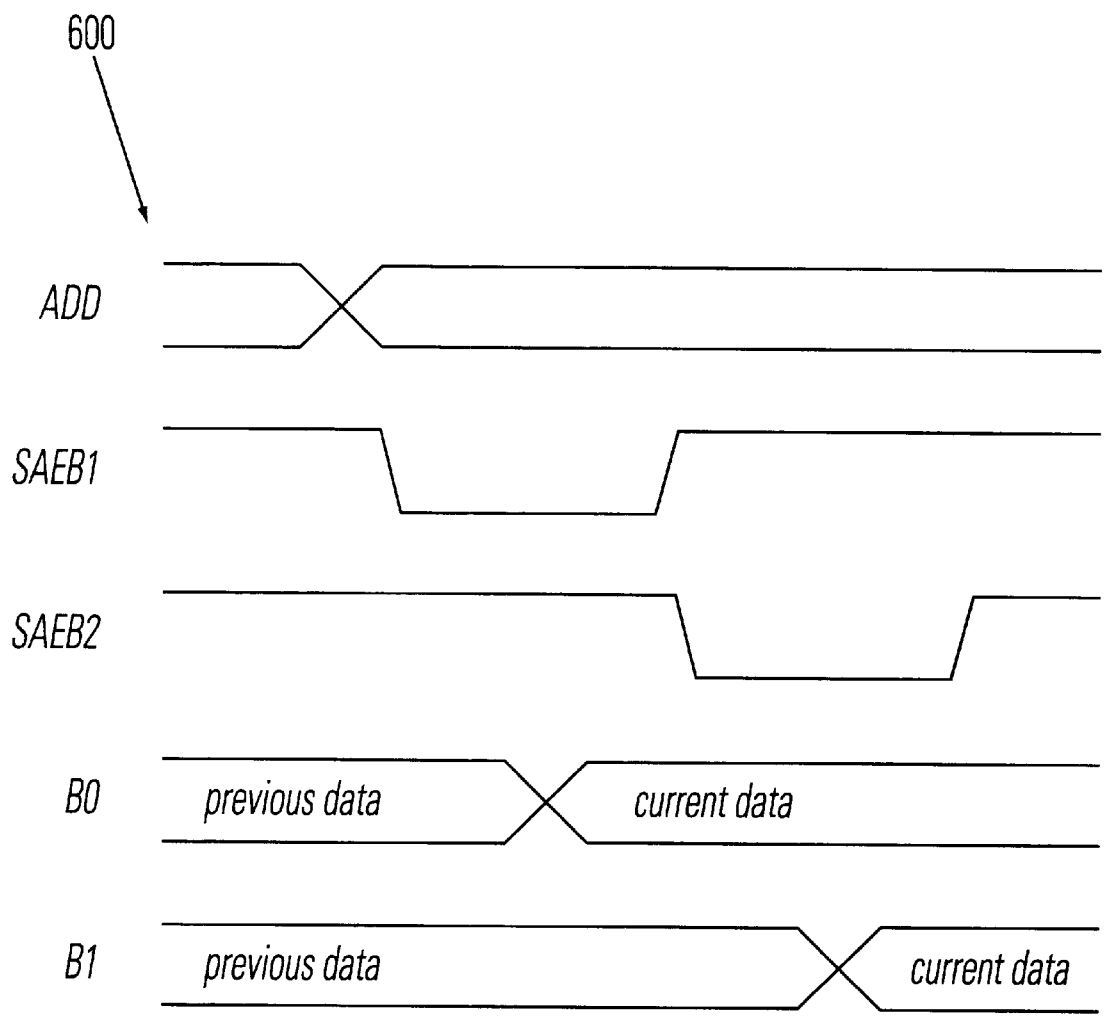
FIG. 6 is a data from simulated operation of one embodiment of the invention.

FIG. 6 is a simulation of operation of voltage sensing for a two level cell with a source voltage VDD of 3.3 v. The signals simulated include the address waveform PAXSW, the data output D0, the row decoder output SWL00, and the sense amplifier output SAB. The simulated values VX, VY, VM, VN, Ic, Ir and Ig correspond to the values identified in the prior figures. In this simulation, signal PAXSW goes low, to select the cell with a threshold voltage of 1.7 v, corresponding to a data "1", and goes high to select a cell with a threshold voltage of 2.5 v, corresponding to a data "0". From the simulation of current flows, focusing before and after time 470 N, it is shown that when a data "1" memory cell is selected, Ic=Ig and Ir=0. After time 470 N, when a data "0" memory cell is selected, Ic=0 and Ir=Ig. The simulation shows a readily measurable voltage differential between VM and VN, as well as a corresponding current differential between Ic and Ir, both of which respond quickly to the difference between a data "1" and a data "0". Other examples also can be used to illustrate this invention.

Consider the example of the operation of circuits shown in FIGS. 3 and 4 with two distinct threshold voltages, 0.8 v for a data "1" and 6.0 v for a data "0". When the selected memory cell has the value "1", the current Ic is flowing through the selected cell. At this time, the voltage input to the differential amplifier for the selected cell is VM=VDD−Rm*Ic. The relative threshold voltage of the reference cell becomes Vt=0.8+Rm*Ic and the current through the reference cell Ir approaches zero. At the same time, the voltage input to the differential amplifier for the reference cell is VN=VDD. When the selected memory cell has the value "0", the current Ic approaches zero. Then VM=VDD and the relative threshold voltage of the refrence cell Vt=0.8 v. Current Ir flows through the reference cell, reducing VN, so VN=VDD−Rn*Ir. This example represents the easier case for reading data, as the threshold voltages are widely separated.

Another example reflects a controlled groundline as in FIG. 5 and threshold voltages of 0.8 v and 1.8 v as data "1" and "0", respectively. When the selected memory cell has the value "1", the current level of the groundline is controlled at the value Ig and current Ic flows through the selected cell. Of course, Ic≦Ig,because Ic+Ir=Ig. When the value "1" is read, VM=VDD−Rm*Ic. The relative threshold voltage of the reference cell is Vt=0.8+Rm*Ic. At the same time, the voltage level VSL of the groundline is around 0.6 v and Ir approaches zero. When the selected memory cell has the value "0" (assuming that Rm*IG is less than the difference in threshold voltages, here, 1.0 v), the initial conditions will be VM=VDD−Rm*Ic, VN=VDD and Vt=0.8+Rm*Ic. Under these conditions, Ir will begin close to Ig and Ic will begin close to zero. With time, the values (as shown in the simulation) will settle to VM=VDD and VN=VDD−Rn*Ir.

Multi-level Voltage Sensing

Figure 7A:
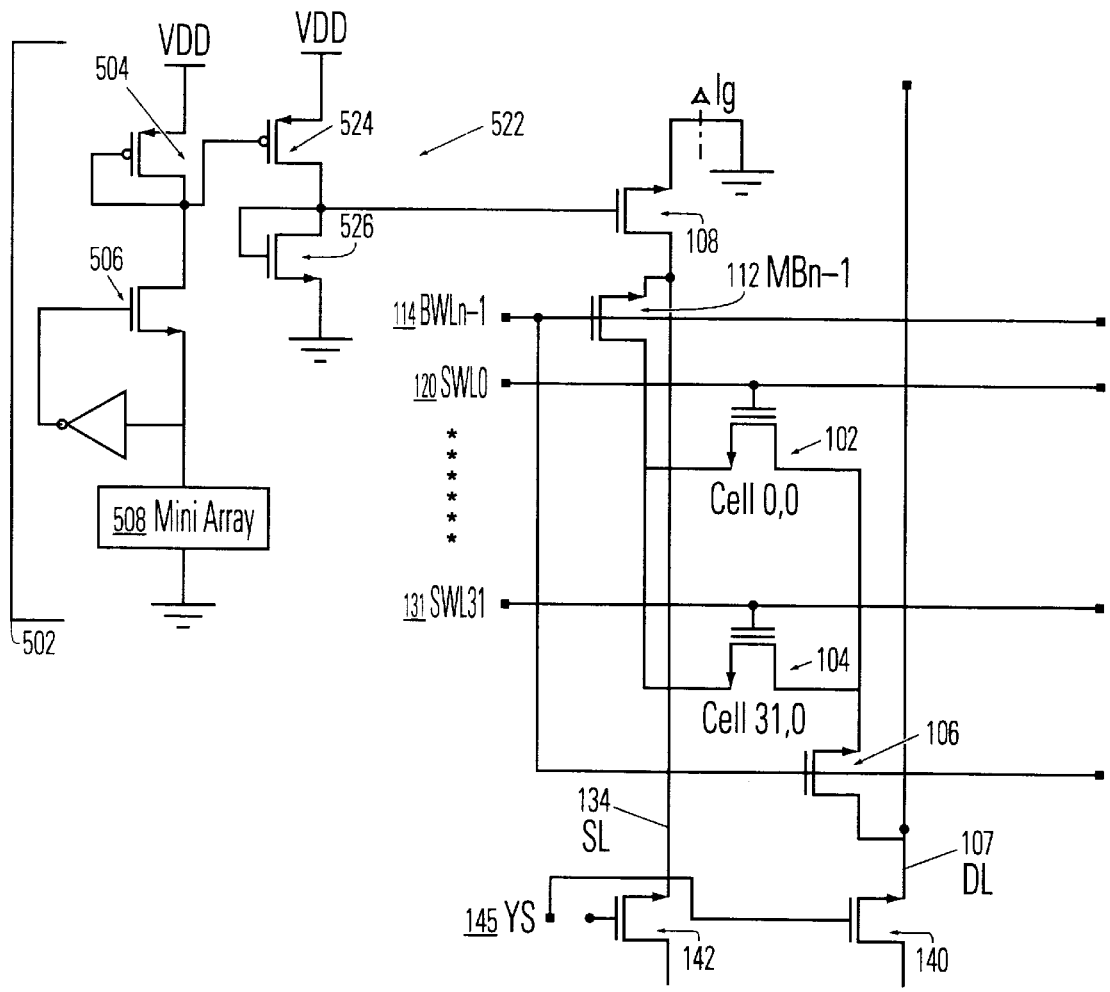
FIG. 7 is a multi-bit cell embodiment of voltage sensing.
Figure 7B:
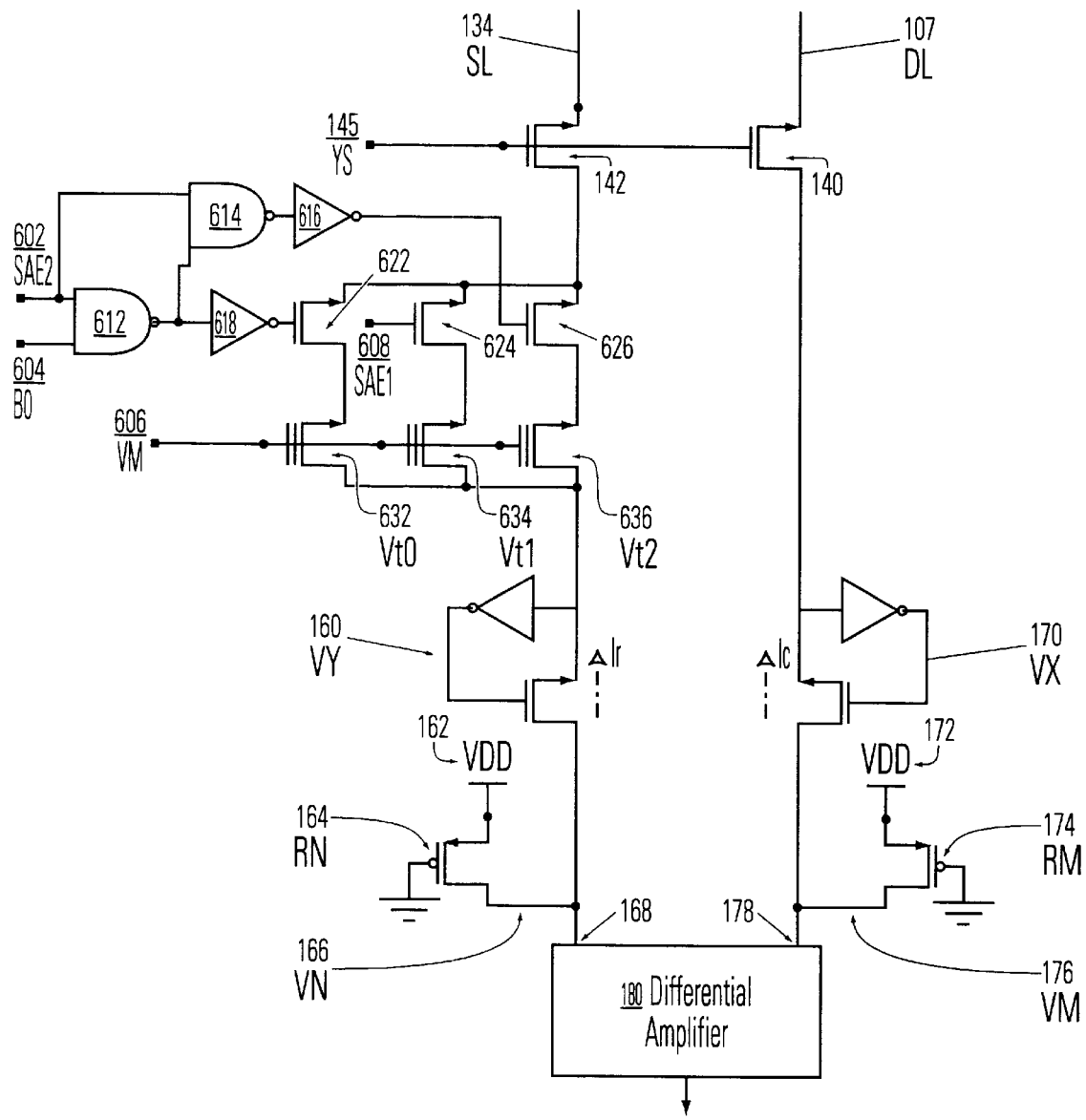
Figure 8:
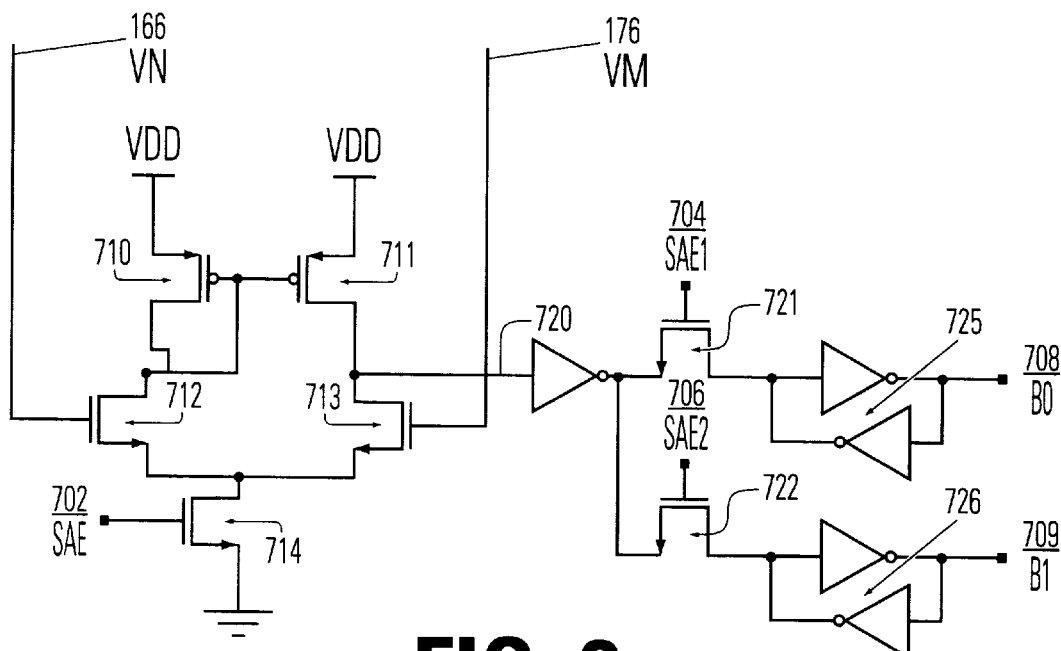
FIG. 8 is a differential amplifier adapted to multi-bit sensing.
Figure 9:
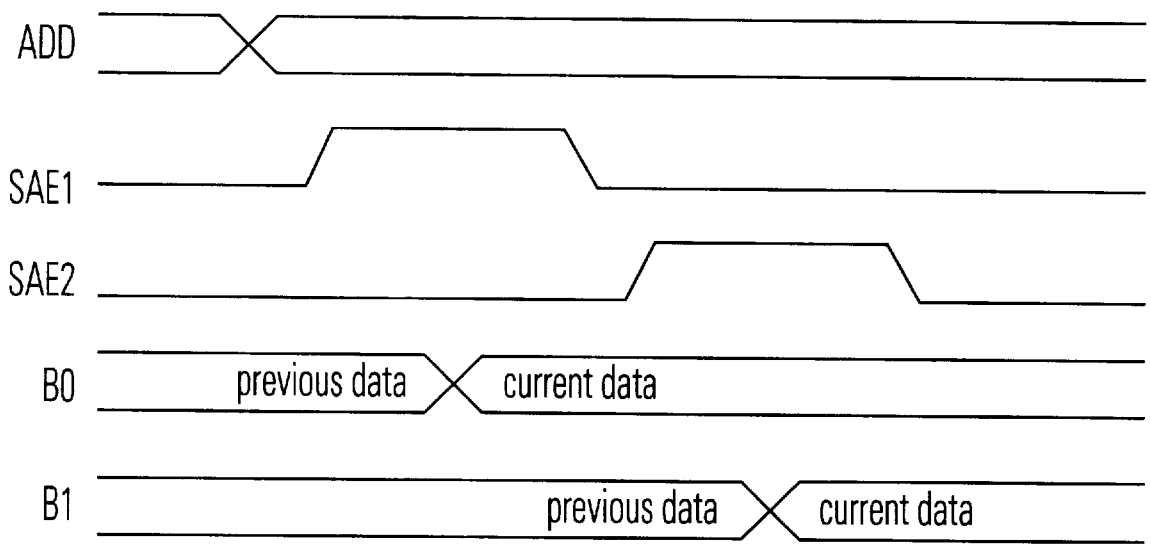
FIG. 9 is a timing diagram illustrating multi-bit sensing.

FIGS. 7–9 illustrate one embodiment of multi-level voltage sensing. FIG. 7 is a circuit diagram which adds multiple reference cells to the circuitry previously described. FIG. 8 depicts one differential amplifier suitable fir multi-level sensing. FIG. 9 is a simplified timing diagram for the circuitry of FIGS. 7A, 7B and 8.

Circuit diagram FIGS. 7A and 7B includes elements 602 through 636 which do not appear in the previous figures. These elements are one embodiment of a multi-level reference array, the threshold voltages in this embodiment being Vt0 from reference cell 632, Vt1 from reference cell 634 and Vt2 from reference cell 636. The control signals are sense amplifier enable phase 2 (SAE2) 602, bit 0 value (B0) 604, voltage for reference cell VM 606, and sense amplifier enable phase 1 (SAE1) 608. Signals SAE2 and B0 are processed through a NAnd gates 612 and 614 and inverters 616 and 618 to control transistors 622 and 626. Signal SAE1 directly controls transistor 624. Through transistors 622, 624 and 626 acting as pass gates, coupling of the reference transistors 632, 634 and 636 is enabled. The reference transistors are coupled through transistor 142 to the same ground to which the selected memory cell is coupled. The reference transistors are further coupled with the reference side bias device 160 and voltage generator to the differential amplifier.

Circuit diagram FIG. 8 is a differential amplifier adapted for multi-level voltage sensing. The inputs to the amplifier are VN 166, which is responsive to the voltage at the source of the selected memory cell, sensed through the reference cells 632, 634 or 636, and VM 176, which is responsive to the voltage at the drain of the selected memory cell. The control signals to the differential amplifier are sense amplifier enable (SAE) 702, sense amplifier enable phase 1 (SAE1) 704, and sense amplifier enable phase 2 (SAE2) 706. Signal SAE 702 is the logical "or" of signals SAE1 704 or SAE2 706. The outputs of the differential amplifier are the value of bit 0 (B0) 708, which is read from the bit latch 725, and the value of bit 1 (B1) 709, which is read from bit latch 726.

The differential amplifier comprises a pair of P-type transistors 710 and 711 with their drains tied to voltage sources VDD and their gates connected to each other. The source of transistor 710 is connected to the drain of transistor 712 and the back to the gate of transistor 710. The gate of transistor 712 is controlled by input VN 166. The source of transistor 711 is connected to the drain of transistor 713 and to an inverter 720. The gate of transistor 713 is controlled by input VM 176. The sources of transistors 712 and 713 are both connected to the drain transistor 702. The gate of transistor 702 is controlled by signal SAE 702 and its source is tied to a ground or virtual ground. On the right side of FIG. 8, the output of inverter 720 is connected to the sources of transistors 721 and 722. The gates of these transistors are controlled by signals SAE1 704 and SAE2 706, respectively. The drains of transistors 721 and 722 are tied to bit latches 725 and 726, each comprising two invertors. The outputs readable from bit latches 725 and 726 are the sensed data values of the selected multi-level memory cell B0 708 and B1 709, respectively.

In operation, the circuits of FIGS. 7 and 8 represent two bits of data as follows:

| Threshold Voltage | Bit 0 Value | Bit 1 Value |
| --- | --- | --- |
| Vt3 | 0 | 0 |
| Vt2 | 0 | 1 |
| Vt1 | 1 | 0 |
| Vt0 | 1 | 1 |

FIGS. 7 and 8 is further explained by the simplified timing diagram FIG. 9. The signals in FIG. 9 are ADD for addressing, SAE1 for sense amplifier enable phase 1, SAE2 for sense amplifier enable phase 2, B0 for the bit 0 data, and B1 for the B1 data. After the address of the selected memory cell has been processed, SAE1 goes high. The value of B0 is a residual value from prior processing during the first part of SAE1 high. SAE1 high enables bit latch 725 through transistor 721 and selects reference cell Vt1 634 through transistor 624. While SAE1 remains high, the differential amplifier determines the value of bit 0 and captures that value in latch 725. The signal B0 then reflects the value of bit 0 in the selected memory cell. After SAE1 returns to low, SAE2 goes high. The value of B1 is a residual value from prior processing during the first part of SAE2 high. SAE2 high enables bit latch 726 through transistor 722. Either reference cell Vt0 632 or reference cell Vt2 636 is selected, depending on the value of B0. Signals SAE2 and B0 are processed through the NAnd gates and invertors 612–618. If B0 is a "1", then Vt0 632 is selected through transistor 622. Otherwise, reference cell Vt2 636 is selected through transistor 626. While SAE2 remains high, the differential amplifier determines the value of bit 1 and captures that value in latch 726. The signal B1 then reflects the value of bit 1 in the selected memory cell.

The present invention, as described above, is adapted to drawing less current through a selected memory cell than conventional current sensing amplifiers. Use of a voltage generator reduces the current draw.

By sensing both the source and drain of a selected memory cell, some embodiments of the present invention produce substantial gains in sensing small voltage differentials in memory cells operating at reduced voltages or storing multiple bits of data. In other embodiments, the present invention accounts for variations in manufacturing processes and fluctuations in operating conditions through use of a current limiting device controlled by a current source through a current mirror and biasing device.

Sensing both the source and drain of a selected memory cell permits sensing of multiple bits stored in the same memory cell at distinct thresholds, thereby increasing the amount of data that can be stored in the same area on a memory device.

The foregoing description of various embodiments of the invention have been presented for purposes of illustration and description. The description is not intended to limit the invention to the precise forms disclosed. Many modifications and equivalent arrangements will be apparent to people skilled in the art.

What is claimed is:

1. A device for sensing multiple threshold voltages of at least one multi-level non-volatile memory cell, the memory cell being selectable from an arranged collection of memory cells, the non-volatile memory cells having a drain and source, comprising:
    at least one memory cell, having a source and drain;
    a first voltage generator, coupled to the drain of the memory cell;
    at least three reference cells having threshold voltages corresponding to threshold voltages for data values stored in the memory cell, coupled to the source of the memory cell;
    a second voltage generator, coupled to the drain of reference memory cell; and
    a differential amplifier coupled to the first and second voltage generators.

2. The device of claim 1, wherein the gate of the reference cell is coupled and responsive to the first voltage generator.

3. The device of claim 2, further comprising:
    a current source having an input stimulus;
    a current mirror coupled to the current source;
    a voltage biasing circuit coupled to the current mirror;
    a virtual ground; and
    a current limiter coupled between the source of the memory cell and file virtual ground, further coupled and responsive to the voltage biasing circuit.

4. The device of claim 3, wherein the current source is comprised of a miniarray having a drain source and gate, and a particular voltage is applied to the miniarray gate as the input stimulus.

5. The device of claim 4, wherein the miniarray is formed during the same process as the non-volatile memory cell.

6. A device for sensing multiple threshold voltages of at least one multi-level non-volatile memory cell, the memory cell being selectable from an arranged collection of memory cells, each memory cell having a respective drain and source, comprising:
    a conductor;
    at least one multi-level non-volatile memory cell, coupled to the conductor;
    a first voltage generator, coupled to the multi-level non-volatile memory cell;
    a plurality of reference memory cells, coupled to the conductor;
    a second voltage generator, coupled to the multi-level non-volatile memory cell;
    logic for selecting among reference memory cells to be compared to the multi-level non-volatile memory cell; and
    a differential amplifier coupled to the reference cells and the non-volatile memory cell.

7. The device of claim 6 further comprising:
    a current source having an input stimulus;
    a current mirror coupled to the current source;
    a voltage biasing circuit coupled to the current mirror; and
    a current limiter coupled between the conductor and both the reference memory cell and the non-volatile memory cell, further coupled and responsive to the voltage biasing circuit.

8. The device of claim 7, wherein the current source is comprised of a miniarray having a drain, source and gate, and a particular voltage is applied to the miniarray gate as the input stimulus.

9. The device of claim 8, wherein the miniarray is formed during the same process as the non-volatile memory cell.

10. A method of sensing for a multi-level non-volatile memory, the memory cell having a source and drain and being selectable from an arranged collection of memory cells, by comparing it to first, second and third reference cells having sources and drains, comprising:
    coupling the drain of the memory cell to a first voltage generator;
    coupling the drain of the first reference cell having a threshold voltage Vt1 to a second voltage generator;
    comparing the voltages of the first and second voltage generators using a differential amplifier to produce a first bit value;
    coupling alternatively the drain of the second reference cell having a threshold voltage
    Vt0 or the drain of the third reference cell having a threshold voltage Vt2 to the second voltage generator, in response to the first bit value; and
    comparing the voltages of the first and second voltage generators using the voltage-sensing differential amplifier.

11. The method of claim 1, further comprising coupling the source of the memory cell to the source of which ever of the first, second and third reference cells are coupled to the second voltage generator.

* * * * *